(12) United States Patent
Maurer et al.

(10) Patent No.: US 11,127,519 B2
(45) Date of Patent: Sep. 21, 2021

(54) DEVICE FOR DEMAGNETIZING ELONGATED COMPONENTS AND METHOD FOR DEMAGNETIZING SUCH COMPONENTS

(71) Applicant: Albert Maurer, Grüt (CH)

(72) Inventors: Albert Maurer, Grüt (CH); Urs B. Meyer, Niederglatt (CH)

(73) Assignee: Albert Maurer, Grüt (CH)

( * ) Notice: Subject to any disclaimer, the term of this patent is extended or adjusted under 35 U.S.C. 154(b) by 480 days.

(21) Appl. No.: 16/138,217

(22) Filed: Sep. 21, 2018

(65) Prior Publication Data

US 2019/0096559 A1 Mar. 28, 2019

(30) Foreign Application Priority Data

Sep. 22, 2017 (CH) ..................................... 0168/17

(51) Int. Cl.
*H01F 13/00* (2006.01)
*G01R 33/12* (2006.01)

(52) U.S. Cl.
CPC ........... *H01F 13/006* (2013.01); *G01R 33/12* (2013.01)

(58) Field of Classification Search
CPC ...... H01F 7/0289; H01F 7/1607; H01F 7/081; H01F 27/245; H01F 27/255; H01F 27/38; H01F 13/006; H01F 13/305; H01F 38/14; H01F 38/12; H01F 38/18; H01F 3/10; G01R 33/04; G01R 33/06; G01R 33/12; F16F 9/53; F16F 9/535; H02K 21/24
See application file for complete search history.

(56) References Cited

U.S. PATENT DOCUMENTS

| | | |
|---|---|---|
| 3,879,754 A | 4/1975 | Ballinger |
| 4,378,581 A | 3/1983 | Kuno et al. |
| 4,388,666 A | 6/1983 | Kuno et al. |

(Continued)

FOREIGN PATENT DOCUMENTS

| | | |
|---|---|---|
| EP | 1791138 A1 | 5/2007 |
| EP | 2755217 A2 | 7/2014 |
| EP | 2851911 A1 | 3/2015 |

OTHER PUBLICATIONS

European Search Report dated Feb. 16, 2018 for Swiss Patent Application CH-11682017 filed Sep. 22, 2017.

*Primary Examiner* — Bryan R Perez
(74) *Attorney, Agent, or Firm* — Paul D. Bianco; Gary S. Winer; Fielt Intellectual Property Law

(57) ABSTRACT

A device for demagnetizing a ferromagnetic, elongated component of any length having a uniform profile which has an accessible surface on one side along its length. The device comprises a rod-shaped, ferromagnetic core having a circumferential shell surface, which is closed off by a front end face and a rear end face. At least one coil is wrapped around the shell surface, with the coil connected to a current source which can generate an alternating current, whereby a magnetic alternating flux is induced in the ferromagnetic core, the flux entering and exiting at the two end faces. A coil is wrapped around the shell surface, with the coil connected to a current source which can generate a direct current to superimpose the magnetic alternating flux with a thereby induced magnetic unidirectional flux through the ferromagnetic core, the flux entering and exiting at the two end faces.

17 Claims, 4 Drawing Sheets

(56) References Cited

U.S. PATENT DOCUMENTS

| | | | | |
|---|---|---|---|---|
| 6,373,245 B1 * | 4/2002 | Kwun | ............... | G01N 29/11 324/240 |
| 2007/0115603 A1 | 5/2007 | Maurer | | |

* cited by examiner

DEVICE FOR DEMAGNETIZING ELONGATED COMPONENTS AND METHOD FOR DEMAGNETIZING SUCH COMPONENTS

TECHNICAL AREA

The invention relates to a device for demagnetizing a ferromagnetic, elongated component of any length with uniform profile having a longitudinal axis which has an accessible surface along its length on one side, wherein the device comprises a rod-shaped, ferromagnetic core having a circumferential shell surface, which is closed off by a front end face and a rear end face, wherein these end faces are aligned facing away from each other and wherein at least one coil is wrapped around the shell surface, which coil is connected at its ends to a power source which can generate an alternating current (AC), whereby a magnetic alternating flux is induced in the ferromagnetic core, which flux enters and exits at the two end faces and in the non-coiled region of the shell surface. The invention also relates to a method for demagnetizing such components.

STATE OF THE ART

Various devices are known for demagnetizing ferromagnetic bodies. As a rule, these bodies are exposed to a strong magnetic alternating flux. This exceeds the coercivity of the magnetized body, so that all magnetic dipoles in the body which are aligned by the magnetization are set in polarity-reversing motion. One then speaks of a ferromagnetic body charged up to the saturation flux density. When this alternating flux fades away, this movement eventually subsides until the electromagnets "freeze" in a disordered state. Alternatively, the body can be strongly heated, which is often not possible. A homogeneous domain structure is formed simultaneously.

The magnetic alternating flux is usually induced by a coil which is supplied with a strong alternating current (AC). The body is brought through the coil and then removed from it for the demagnetization.

Since the current strength for the demagnetization must be very large, there is a need to be able to demagnetize large components with smaller devices that can not be completely passed through a device.

Thus, a magnetic alternating flux can be induced by a coil around an iron core which forms a U-shape. The magnetic field lines then pass through the iron core and then finally exit at the open ends. Thus, a component that is larger than the inner region of the coil, can push in this open region or can rotate in this region. Such devices are particularly suitable for hard disks whose data are to be permanently deleted.

Another problem of demagnetization is the residual magnetism left over in a component during "freezing". This happens because at the time of solidification, a residual magnetic flux always still acts on the component, caused, for example, by the earth's magnetic field. In order to be able to eliminate this residual magnetic flux, as shown in EP 2851911 A1, a protection cover can be arranged around the component, which cover shields an external magnetic field until the magnetic alternating flux has completely decayed. However, this requires that the component is completely located in the shielding during the entire demagnetization phase. For very large components, this is expensive, impossible with infinitely long stretched components.

It has now been shown that the known devices are not suitable for completely demagnetizing ferromagnetic, elongated, in particular rigid and/or fixedly installed components of any length. The most important example here are permanently laid streetcar or railroad tracks. These magnetize over time, on the one hand by the earth's magnetic field, on the other hand also by the magnetic rail brakes of the trains, which induce magnetic fields of 10 mT in the air gap to the rail even in the switched off state.

The rails are separated from one another at their joints by insulation layers, so that a monitoring system of a catenary center can determine whether a rail section is free or occupied by a train. As a result of the magnetization of the rails, metal chips, nails, washers and so on accumulate gradually at the joints because the magnetic flux escapes there until finally conductor bridges are created which bypass the insulation. This means that reliable information about the positions of the trains is no longer obtained in the catenary center, which can lead to serious signal interference and ultimately to accidents.

Other examples of use are permanently installed carriers, but also long iron tubes that are too large to immerse in their entire circumference into a demagnetizing magnetic flux loop. A device for this purpose would be very large and the enormous power consumption would bring further problems. In addition, the residual magnetization created by the environment can not be eliminated or only eliminated with very great effort.

PRESENTATION OF THE INVENTION

One aspect of the present invention relates to a device which can achieve demagnetization of a ferromagnetic, elongated component of any length described above, wherein the residual magnetization is to be smaller than a predetermined tolerance value. In particular, the device should be applicable for laid streetcar or railroad tracks as well as other, built-in profiles, installed lines and suspension cables and large metal pipes that are only accessible from one side.

Another aspect relates to a self-sufficient device for the stated purpose. In addition, a method is to be described which can achieve the desired demagnetization.

Further advantageous embodiments are also disclosed.

According to the invention, with a demagnetizing device mentioned at the beginning, a coil is wrapped around the shell surface of the ferromagnetic core, which coil is connected at its ends to a current source which can generate a direct current (DC) to superimpose the magnetic alternating flux with a uniform magnetic unidirectional flux thereby induced by the ferromagnetic core, which enters or exits the two end faces. The coil may be the same coil that is supplied with alternating current, or a coil other than this. All coil windings run parallel to each other. This is also true when two coils are used. The flux lines of the magnetic alternating flux and the magnetic unidirectional flux are superimposed in parallel, that is, they do not intersect. In operation, the front end face faces the component and is arranged close to its surface, the rear end face faces away from the component. The core is wider than the width of the component. The planes in which the coil windings are located run parallel to the two end faces of the core. They generate magnetic field lines which penetrate almost perpendicularly into the component and run in both directions of its longitudinal axis in this, until they finally, distributed over a relatively long distance, exit from the component and enter the rear end face of the core.

In a preferred embodiment, the device comprises a short-distance transport device which, on the one hand, ensures a distance between the front end face and the surface of the demagnetizing component during operation, which also remains within a predetermined range when the magnetic forces occurs during operation, and on the other hand, permits a translational relative movement between the ferromagnetic core and the component along its entire length.

Such a device is used with a short-distance transport device in the method according to the invention for demagnetizing a ferromagnetic, elongated component. In this method, a constant alternating current is generated in the coil, which current induces a magnetic alternating flux in the ferromagnetic core, which flux enters and exits at the two end faces. At the same time, a constant direct current is generated in a coil, which current induces a uniform magnetic unidirectional flux superimposing the magnetic alternating flux in the ferromagnetic core, which enters or exits the two end faces. The coil may be the same or another coil. The short-distance transport device always ensures a distance between the front end face and the surface of the component within a predetermined range and causes a translational relative movement between the ferromagnetic core and the component along its entire length, while alternating current and direct current are kept constant.

The alternating current in this case is to be so strong that the zone of the component lying under the front end face is completely saturated by the induced magnetic alternating flux. The direct current current is adjusted in each case to the induced magnetization polarity of the component. After a demagnetizing passover, the residual magnetism remaining on the component is measured and the method is repeated for as long as needed with corrected direct current intensities until this residual magnetism has fallen below a predetermined tolerance value.

During the demagnetization of a tube, the short-distance transport device also causes a relative movement about the longitudinal axis of the component during the demagnetization, which is carried out in addition to the translational relative movement between the ferromagnetic core and the component along its entire length.

BRIEF DESCRIPTION OF THE DRAWINGS

The invention will be explained in more detail with reference to the drawings in the following. Shown are.

WAYS TO CARRY OUT THE INVENTION

Figure 1:
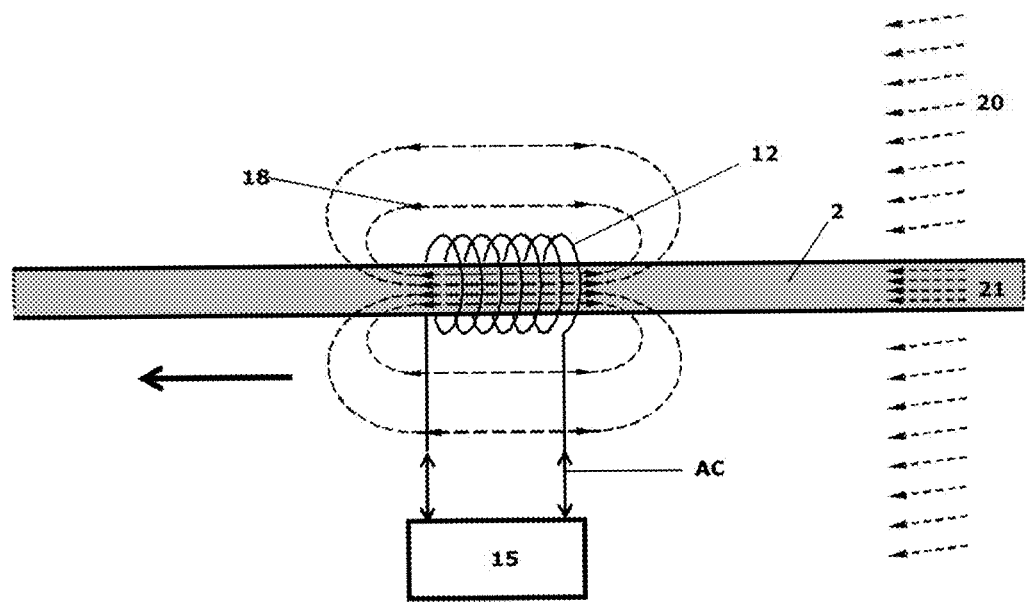
FIG. 1 a schematic representation of a device for demagnetizing a wire cable according to the prior art.

A solution known from the steel industry according to FIG. 1 consists in multiple windings of the component 2, here in the form of a rod material, with a flexible cable. This cable is thus wound into a coil 12, which is fed with an alternating current source 15 and the rod material is continuously moved down, as indicated by an arrow. A magnetic flux corresponding to the flux lines 18, which magnetically flow through the component 2, is produced in the wound zone of the coil 12.

The magnetic flux of the magnetic field of the earth 20 acting in the wider environment is collected in the ferromagnetic material of the component 2 and appears there as a proportion of an internal magnetism 21. This inner magnetic flux 21 is composed of the magnetism permanently contained in the material (remanence) and a proportion which is caused by the magnetic field prevailing in the environment.

The magnetic alternating flux 18 generated by the alternating current in the coil 12 decreases with the passage and removal of the material with demagnetizing effect. However, such a method is not practical because the multiple windings of the component 2 are difficult, because the component 2 must be accessible on all sides, and finally, because the course of the magnetic alternating flux does not allow complete demagnetization.

Figure 2:
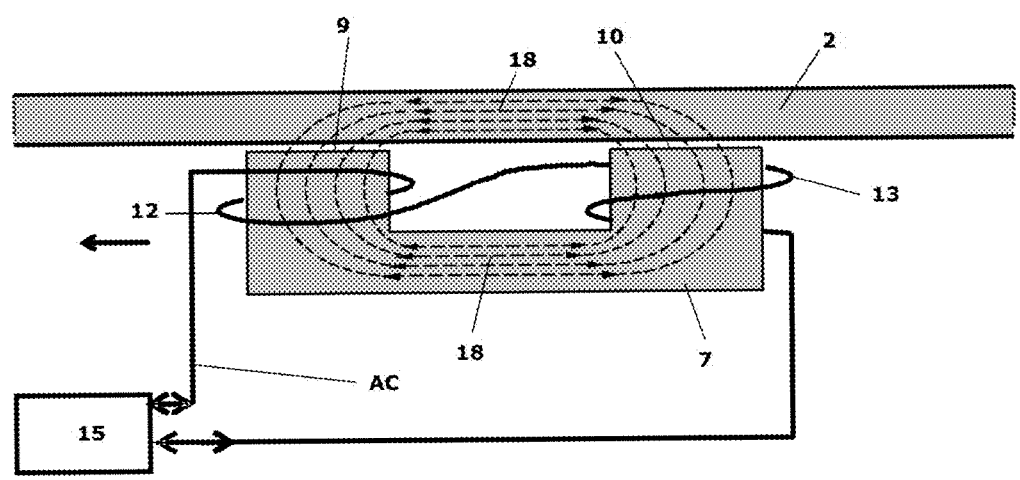
FIG. 2 a schematic representation of a device in the form of a yoke, for demagnetizing a long component according to the prior art.

In FIG. 2, a solution is described which gets by with a one-sided access to the component 2. The alternating current supplied by the current source 15 flows through a pair of coils 12, 13 which is mounted on the magnetic poles near the end faces 9, 10 of a yoke-shaped ferromagnetic core 7. The end faces 9, 10 are thus both aligned in the same direction and both facing the component 2. The magnetic magnetic alternating flux 18 arising in the component 2 essentially follows the flux lines through the ferromagnetic core 7 and through the two end faces 9, 10, or through the magnetic poles. Such an arrangement is used in practice for magnetizing a cable in the magnetic inductive cable test, wherein current source 15 and coil 12, 13 can be replaced by permanent magnets in the magnetic poles near the end faces 9, 10. Here also, the component 2 moves relative to the core 7 continuously, as shown by an arrow in FIG. 2.

This arrangement can generate a magnetic alternating flux 18 by means of alternating current in the coil 12, 13. Such a method allows, as experiments have shown, a demagnetization, but which can be compensated only in a very limited way by the externally induced magnetic fields.

The device 1 according to the invention can therefore at hand be described as follows with reference to FIGS. 3 and 4. It is suitable for demagnetizing a ferromagnetic, elongated component 2 of any length 4 having uniform profile 3 having a longitudinal axis 5. The profile 3 has an accessible surface 6 on one side along its length 4. The device 1 comprises a rod-shaped, ferromagnetic core 7 having a circumferential shell surface 8, which is closed off by a front end face 9 and a rear end face 10. The front end face 9 faces the component 2 in use. These end faces 9, 10 are oriented facing away from each other. Their surface normals point in opposite directions. At least one coil 12 is wrapped around the shell surface 8, which coil is connected at its ends 14 to a current source 15 which can generate an alternating current (AC). In use, this alternating current induces a magnetic alternating flux 18 in the ferromagnetic core 7, which flux enters and exits at the two end faces 9, 10 and in the non-coiled region of the shell surface 8. According to the invention, a coil 13 is wrapped around the shell surface 8 of the ferromagnetic core 7, which coil is connected at its ends 14 to a current source 16 which can generate a direct current (DC) to superimpose the magnetic alternating flux 18 with a uniform magnetic unidirectional flux 19 induced by the direct current through the ferromagnetic core 7, which enters or exits the two end faces 9, 10. Depending on the width of the coils, the flux lines generated by them also enter and exit the non-coiled region of the shell surface 8.

Figure 3:
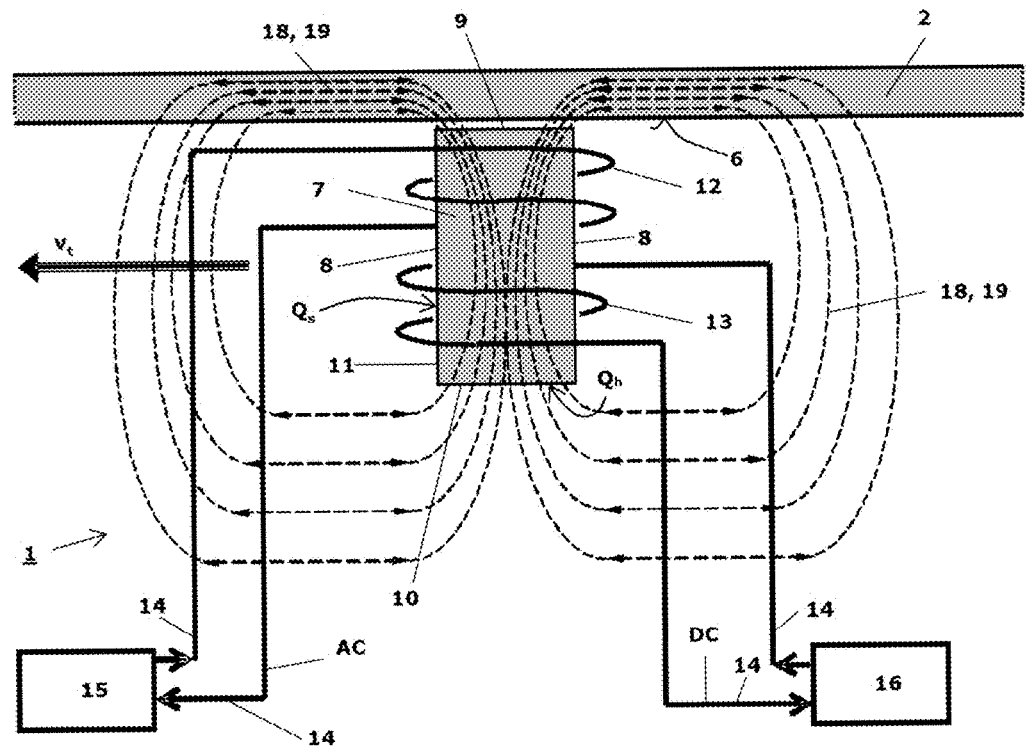
FIG. 3 a schematic representation of a device according to the invention for demagnetizing a long component.

As shown in FIG. 3, the at least one coil 12 may be an alternating current coil 12, and the coil 13 for supplying direct current may be a direct current coil 13 other than the alternating current coil 12. Preferably, the alternating current coil 12 is arranged closer to the front end face 9 than the direct current coil 13. In any case, however, the windings of the two coils 12, 13 run parallel to one another, they do not intersect orthogonally. As a result, the field lines of the magnetic alternating flux 18 and of the magnetic unidirectional flux 19 generated by them also run parallel to one another at each point, and they also do not intersect orthogonally. This is also apparent from FIG. 3.

Figure 4:
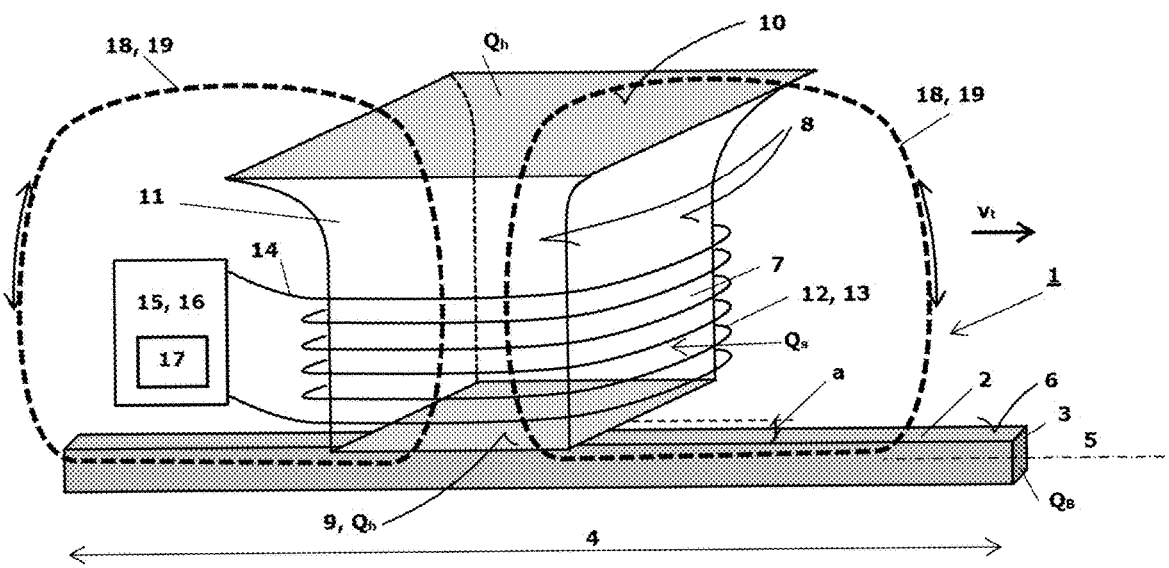
FIG. 4 a schematic perspective representation of an alternative device according to the invention.

Alternatively, as shown in FIG. 4, by adding a suitable circuit construction 17, the function distributed to two coils 12, 13 and two current sources 15, 16 to induce a magnetic alternating field superimposed by a magnetic unidirectional field 19 can even be fulfilled with a single power source 15 or 16 and with a single coil 12 or 13. An alternating current superimposed with DC offset thus flows through this coil.

When carrying out the method, the ferromagnetic core 7 wrapped around by one or two coils 12, 13 acts with its front end face 9 on the component 2 to be demagnetized. An alternating current used to demagnetize flows through the coil 12, which current is fed from the source 15. The alternating current is kept constant and ensures that the region of the component 2 lying under the front end face 9 of the ferromagnetic core 7 is completely magnetically saturated. Direct current compensating the remaining magnetism flows through the coil 12, 13, which current is fed from the source 15, 16. This direct current is variable and is adjusted according to the residual magnetism remaining before demagnetization, but then kept constant during the method. The component 2 moves relative to the device 1 continuously at a speed $v_t$, as shown by an arrow in FIG. 3.

The rear end face 10 of the ferromagnetic core 7 facing away from the component 2 protrudes from the section of the core 7 covered by the coils 12 and 13. The magnetic fluxes 18, 19 collect in this rear region 11 of the core 7 not wrapped around by any coil 12, 13, as can be seen schematically from the flux lines 18, 19. In this rear region 11, the ferromagnetic core 7 may have a larger cross-sectional area $Q_h$ than the cross-sectional area $Q_s$ in a region wrapped around by one of the coils 12, 13 in order to influence the course and the distribution of the magnetic alternating flux 18. This magnification can, as shown in FIG. 4, be designed symmetrically. Alternatively, the rear cross-sectional area $Q_h$ can also be designed magnified in one direction only, preferably counter to the direction of movement.

Figure 5:
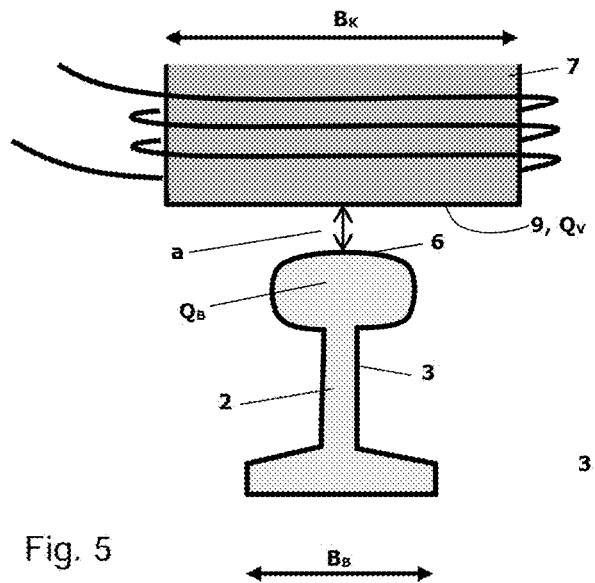
FIG. 5 A component in the form of a railroad track in cross-section with a part of the core and a coil.
Figure 6:
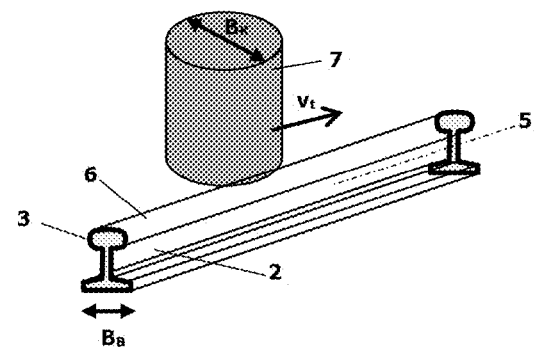
FIG. 6 A component in the form of a railroad track in a perspective view with a core of the device.

FIGS. 5 and 6 show a component 2 having a cross-section 3 in the form of a schematic railroad track in cross-section or in perspective, over which the ferromagnetic core 7 of the device 1 according to the invention is arranged at a distance a and moves in the direction of the arrow relative to the component 2 during demagnetization at the speed $v_t$. The cross-sectional area $Q_v$ of the ferromagnetic core 7 in the region of the front end face 9 is preferably larger than the cross-sectional area $Q_B$ of the component 2 at the point at which it is to be magnetized.

In addition, it is proposed that the width $B_K$ of the ferromagnetic core 7 on the end face 9, which is aligned in operation transversely to the longitudinal axis 5 of the component 2, is wider than the corresponding entire width $B_B$ of the component 2, which extends below the accessible surface 6.

Figure 7:
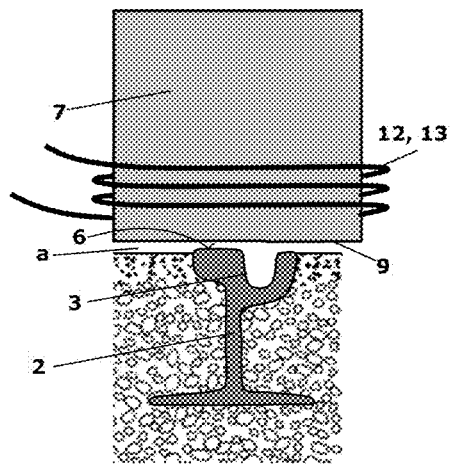
FIG. 7 A component in the form of a streetcar track laid in the ground in cross-section with a core and a coil.

As already mentioned, the component 2 may be a streetcar track, as shown in FIG. 7.

Figure 8:
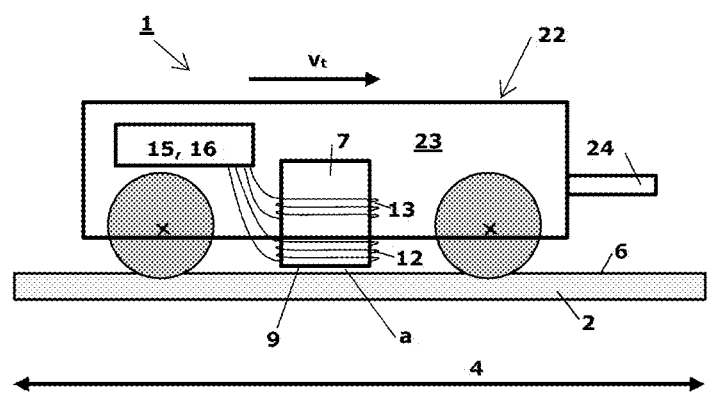
FIG. 8 a side view of a device according to the invention with a short-distance transport device and a component in the form of a rail in use.

In a particularly preferred embodiment, shown in FIG. 8, the device 1 comprises a short-distance transport device 22, which, on the one hand, ensures in operation the preferred distance a between the front end face 9 of the ferromagnetic core 7 and the surface 6 of the component to be demagnetized 2, which also remains within a predetermined range $a_1 \leq a \leq a_2$ with the magnetic forces induced in operation, and on the other hand, permits a translational relative movement $v_t$ between the device 1 and the component 2 along its entire length 4.

This distance a should be smaller than the root of the cross-sectional area $Q_B$ of the component 2, as shown in FIG. 5. In addition, this distance a should be greater than expected unevenness of the surface 6 of the component 2 over its entire length 4. In particular, curvatures of the component 2 can have a great effect on the distance a when the short-distance transport device 22 moves on the component 2. Contact between the core 7 and the component should be avoided so that no grinding and braking adhesion of the core 7 takes place on the component 2.

When the component 2, as shown in FIG. 8, is a track, the short-distance transport device 22 is preferably designed as a rail car 23 with a trailer coupling 24. A towing vehicle coupled to this trailer coupling 24 can pull the rail car 23 along the tracks evenly at the desired speed. The ferromagnetic core 7 is then firmly attached to the rail car 23, so that the distance a to the component 2, therefore to the track, is maintained. The short-distance transport device 22 may in particular have no ferromagnetic components in the magnetic field of action between the ferromagnetic core 7 and the component 2. If steel wheels are used as rolling stock of the short-distance transport device 22, they should be duly spaced from the core 7.

In addition, one or more current sources 15, 16 may be arranged on this short-distance transport device 22, for example, including a generator. Other components, such as the circuit construction 17, not shown in FIG. 8, may be added if the device 1 is to be operated with a single coil 12.

Figure 9:
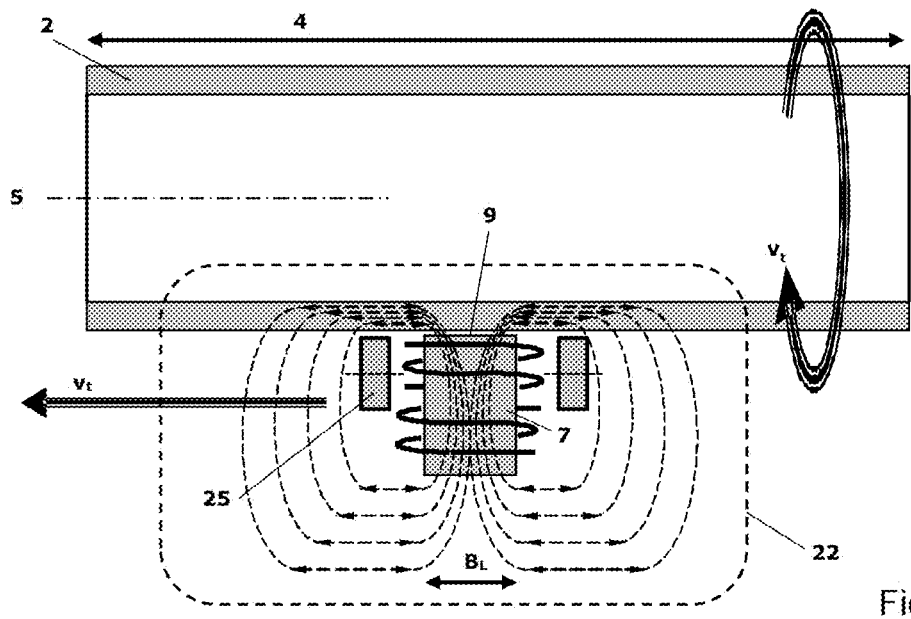
FIG. 9 a schematic representation of a device according to the invention for demagnetizing a long component in the form of a tube.
Figure 10:
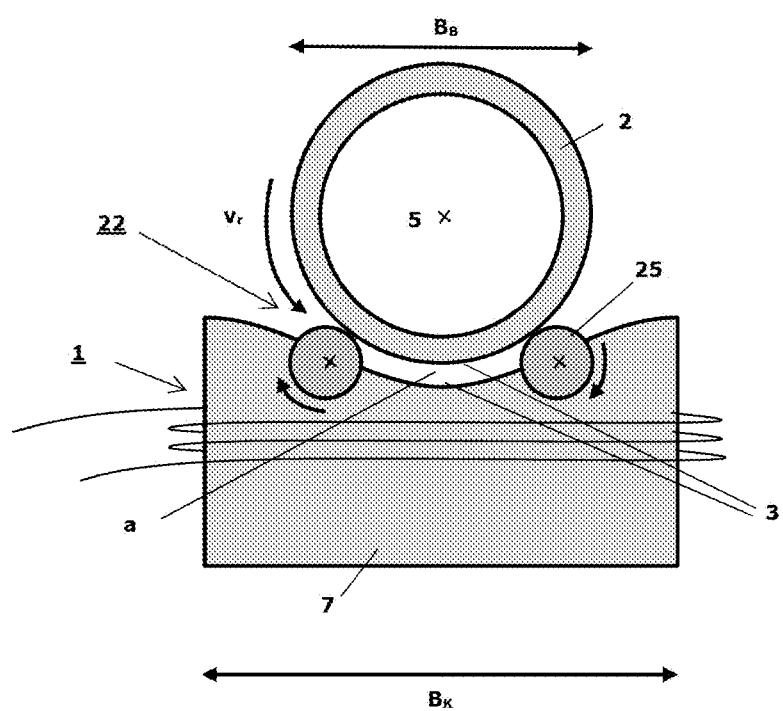
FIG. 10 a cross-sectional view of an inventive device with a short-distance transport device and a component in the form of a tube in use.

In an alternative embodiment according to FIG. 9 or 10, the device 1 comprises a short-distance transport device 22, which, in addition to the longitudinal movement $v_t$, also permits rotational relative movement $v_r$ between the ferromagnetic core 7 and the component 2 about the longitudinal axis 5 of the component 2. In this embodiment, the component 2 is a tube to be demagnetized. The short-distance transport device 22 is preferably fixedly mounted and also fixes the component 2, for example, to four or more designated rollers 25, at a predetermined distance a to the ferromagnetic core. 7 The component 2 is supported on these rollers 25 of the short-distance transport device 22 and is spirally moved forward on it. The rollers 25 can thus be driven to rotate the component 2 on the one hand about its own longitudinal axis 5 and at the same time to achieve an offset by approximately the width $B_L$ of the ferromagnetic core 7 in the direction of the longitudinal axis 5 with each rotation. Additional, not shown bearings, supports or suspensions can additionally stabilize the component 2. Alternatively, the short-distance transport device 22 may not be stationary, but rather move the component 2 down along its length 4, while the component 2 in turn is rotated uniformly. It is important that the predetermined distance a between the component 2 and the ferromagnetic core 7 is always maintained. For this purpose, it is also possible to use sliders with or without rollers made of nonferromagnetic material, which ensure this distance a. These can also be arranged directly between the component 2 and the core 7.

Preferably, the profile 3 of the front end face 9 of the ferromagnetic core 7 is the profile 3 of the accessible surface 6 of the component 2, here the curvature of the tube 2 adapted, as shown in FIG. 10. By adapting the profiles 3, the distance a between the component 2 and the core 7 can be kept in an optimum range, which can improve the penetration of the magnetic flux 18, 19. The width $B_B$ of the rotating object 2, which is determined here by its diameter, must be narrower than the width $B_K$ of the ferromagnetic core 7. This is also thus shown in FIG. 10. FIG. 9 is more schematically understood in this regard.

A device 1 described above is used with a near-transport device 22 in the method according to the invention for demagnetizing a ferromagnetic, elongated component 2 of any length 4 having a longitudinal axis 5 which has an accessible surface 6 at least on one side along its length 4. For this purpose, a constant alternating current AC is first generated, which induces a magnetic alternating flux 18 through the ferromagnetic core 7, which enters and exits at the two end faces 9, 10 and a constant direct current DC, which induces a uniform magnetic unidirectional flux 19 superimposing the magnetic alternating flux 18 through the ferromagnetic core 7, which also enters or exits at the two end faces 9, 10. The short-distance transport device 22 always ensures a distance a between the front end face 9 and the surface 6 of the component 2 to be demagnetized within a predetermined range between $a_1$ and $a_2$ and causes a translational relative movement $v_t$ between the ferromagnetic core 7 and the component 2 along its total length 4, while the alternating current and direct current are kept constant. The translational relative movement $v_t$ is, depending on the frequency of the alternating current, approximately between 1-3 m/s.

The magnetic field can also be switched on on the component 2 itself. Preferably, however, before the induction of the magnetic fluxes 18, 19, the device 1 is brought into a distance of the component 2 in which the subsequent magnetic effect on the component 2 is smaller than an external field 20 prevailing in the environment. Subsequently, the alternating current AC and the direct current DC are applied to generate the magnetic fluxes 18, 19. Only then is the device 1 brought into the vicinity of the component 2. The short-distance transport device 22 now always ensures a distance a between the front end face 9 and the surface 6 of the component 2 to be demagnetized within a predetermined range between $a_1$ and $a_2$. In addition, the short-distance transport device 22 causes a translational relative motion $v_t$ between the ferromagnetic core 7 and the component 2 along its entire length 4.

In a preferred application, after the demagnetization has been carried out to the end of the component 2, the device 1 is brought into a distance of the component 2, in which the magnetic effect on the component 2 is smaller than an external field 20 prevailing in the environment, for example, the earth's magnetic field. Subsequently, the alternating and direct currents are switched off by the coils 12, 13, so that further magnetic fluxes 18, 19 are no longer induced. This ensures that no residual magnetization remains even in the last track section of the component 2.

In an expanded preferred method, a device 1 is used whose short-distance transport device 22 additionally allows a rotational relative movement $v_r$ between the ferromagnetic core 7 and the component 2 about the longitudinal axis 5 of the component 2. In this method, the component 2 rotates as a spiral relative to the device 1, in that the short-distance transport device 22, in addition to the translational relative motion $v_t$ between the ferromagnetic core 7 and the component 2 along its entire length 4, also causes a rotational relative movement $v_r$ about the longitudinal axis 5 of the component 2. The spiral thus traversed has a rise height which corresponds approximately to the width $B_L$ of the ferromagnetic core 7 in the direction of the longitudinal axis 5 in the region of the front end face 9. The vehicle speed $v_t$ in this case is approximately similar to the case described earlier and depends on the alternating current frequency.

During demagnetization, the applied magnetic alternating field 18 with the correction field, which is caused by the magnetic unidirectional field 19, distances itself from a demagnetized point. As a result, the flux density at this point decreases and approaches zero, while the external field 20 and in particular the internal magnetic flux 21, as described in FIG. 1, remains constant. Since the decay, due to the applied DC current, extends asymmetrically, there is always a "push" in one direction, most likely against the external field 20. The stronger the inner magnetic flux 21 through this external field 20, the higher the direct current must be set, so that during the "freezing", the counter-push compensates as much as possible the alignment of the electromagnets forced by the external field 21. In this way, it is possible to reduce the residual magnetization to a small, tolerable value, although the component is not protected by a shield from the external field during freezing and thus an inner magnetic flux 21 is configured.

After demagnetization, the remaining residual magnetism on the component 2 is measured. If this is higher than a specified tolerance value, the method is repeated with appropriately corrected direct current current strengths until this residual magnetism has fallen below this specified tolerance value.

The short-distance transport device 22 may also be a fixed device such as a robot arm, a machine tool or a portal.

It has been found in studies of the present invention that when demagnetizing magnetized bodies, such as railroad tracks, a slow decay of the two applied magnetic fields 18, 19 is of great importance. The magnetic field lines, as they arise in FIG. 1, are suitable in principle because the field lines 18 gradually decrease with the distance to the coil 12. Unfortunately, this device is only suitable for objects that can be wrapped.

This is not the case in the device of FIG. 2. The field lines 18 all run from the object 2 into the end faces 9, 10, which both face the object. The density of the field lines concentrates on a narrow range and then decreases very rapidly. Hardly any are measurable outside the yoke. Therefore, yokes are not suitable for solving the problem underlying this invention. These perform a good job of magnetizing in the region within the two poles because the field lines are very strong there.

The advantage of the present embodiment is therefore in particular that a rod choke is used, as shown in FIG. 3, comprising a rod-shaped ferromagnetic core 7, which is wrapped on its shell surface 8 with one or two coils 12, 13. The magnetic field lines 18, 19 generated thereby are very concentrated in the direction opposite to the direction of travel in the region lying near the core 7, which is important for the ferromagnetic body to be charged up to the saturation flux density. After that, the field strength decreases continuously but slowly, so that the dipoles freeze again in disordered states. To enhance this effect, the core 7 according to FIG. 4 is designed enlarged on the rear end face 10, at least on the side facing away in the direction of travel $v_t$, as already described.

LIST OF REFERENCE NUMBERS

1 Device
2 Component
3 Profile
4 Length
5 Longitudinal axis
6 Surface, accessible surface
7 Core, ferromagnetic core
8 Shell surface
9 Front end face
10 Rear end face
11 Rear region of the core
12 Coil, alternating current coil
13 Coil, direct current coil
14 End of a coil
15 Power source, power source for generating alternating current
16 Power source for generating direct current
17 Circuit construction
18 Magnetic alternating flux
19 Magnetic unidirectional flux
20 Magnetic flux of an external magnetic field (earth's magnetic field)
21 Inner magnetic flux
22 Short-distance transport device
23 Rail car
24 Trailer coupling
25 Roller
AC alternating current
DC direct current
a distance component—core
a1 ... a2 range in which a is permissible ($a_1 \leq a \leq a_2$)
$v_t$ translational relative movement between the ferromagnetic core and the component along its entire length
$v_r$ rotational relative movement between the ferromagnetic core and the component about its longitudinal axis
$Q_h$ cross-sectional area of the core in the rear region
$Q_s$ cross-sectional area of the core in the region of a coil
$Q_v$ cross-sectional area of the core in the region of the front end face
$Q_B$ cross-sectional area of the component
$B_K$ width of the ferromagnetic core transverse to the longitudinal axis
$B_L$ width of the ferromagnetic core along the longitudinal axis
$B_B$ width of the component under the accessible surface

The invention claimed is:

1. A device for demagnetizing a ferromagnetic elongated component of any length having a uniform profile having a longitudinal axis which has an accessible surface on one side along its length, wherein the device comprises a rod-shaped, ferromagnetic core having a circumferential shell surface which is closed off by a front end face and a rear end face, wherein these end faces are aligned facing away from each other and wherein at least one coil is wrapped around the circumferential shell surface, which the coil is connected at its ends to a current source which can generate an alternating current, whereby a magnetic alternating flux is induced in the ferromagnetic core, which flux enters and exits at the two end faces and in the non-coiled region of the circumferential shell surface, wherein a coil is wrapped around the circumferential shell surface of the ferromagnetic core, which the coil is connected at its ends to a current source which can generate a direct current for superimposing the magnetic alternating flux with a thereby induced magnetic unidirectional flux through the ferromagnetic core, which enters and exits at the two end faces.

2. The device according to claim 1, wherein the alternating current source with the at least one coil comprises a circuit construction which makes it possible to supply the same coil simultaneously with a direct current in order to superimpose the magnetic alternating flux with the desired magnetic unidirectional flux.

3. The device according to claim 1, wherein the at least one coil is an alternating current coil and wherein the coil for supplying the direct current is a direct current coil other than the alternating current coil.

4. The device according to claim 3, wherein the alternating current coil is arranged closer to the front end face than the direct current coil.

5. The device according to claim 1, wherein the ferromagnetic core has a rear region near the rear end face, which region is not wrapped by any coil, in order to collect magnetic flux.

6. The device according to claim 5, wherein the ferromagnetic core has a larger cross section in the rear region than in a region which is wrapped by a coil.

7. The device according to claim 1, wherein a cross-sectional area of the ferromagnetic core in the region of the front end face is greater than a cross-sectional area of the ferromagnetic elongated component.

8. The device according to claim 1, wherein a width of the ferromagnetic core, which is aligned in operation transversely to the longitudinal axis of the ferromagnetic elongated component, is wider than a width of the ferromagnetic elongated component that extends below the accessible surface.

9. The device according to claim 1, wherein a profile of the front end face is adapted to the profile of the accessible surface.

10. The device according to claim 1, wherein the device comprises a short-distance transport device which, on the one hand, in operation ensures a distance between the front end face and the surface of the ferromagnetic elongated component to be demagnetized, which also remains within a predetermined range when magnetic forces are induced during operation, and on the other hand, permits a translational relative movement between the ferromagnetic core and the ferromagnetic elongated component along its entire length.

11. The device according to claim 10, wherein the distance is smaller than the root of the cross-sectional area of the ferromagnetic elongated component.

12. The device according to claim 10, wherein the short-distance transport device additionally permits a rotational relative movement between the ferromagnetic core and the ferromagnetic elongated component about the longitudinal axis of the ferromagnetic elongated component.

13. A method for demagnetizing a ferromagnetic elongated component of any length having a longitudinal axis which has an accessible surface at least on one side along its length, using the device according to claim 10, the method comprising a) generating a constant alternating current, which induces a magnetic alternating flux through the ferromagnetic core, which flux enters and exits at the two end faces, and
b) generating a constant direct current, which induces a magnetic unidirectional flux superimposing the magnetic alternating flux through the ferromagnetic core, which flux enters and exits at the two end faces,
c) wherein the short-distance transport device always ensures a distance within a predetermined range between the front end face and the surface of the ferromagnetic elongated component to be demagnetized, and
d) wherein the short-distance transport device causes a translational relative movement between the ferromagnetic core and the ferromagnetic elongated component along its entire length while the alternating current and the direct current are kept constant.

14. The method according to claim 13, wherein
prior to induction of the magnetic fluxes, the device is brought into a distance of the ferromagnetic elongated component in which a magnetic effect of magnetic fluxes on the ferromagnetic elongated component is smaller than a magnetic flux of a magnetic field prevailing in the environment,
then steps a) and b) are carried out,
then the device is brought into a vicinity of the ferromagnetic elongated component, and
then steps c) and d) are carried out.

15. The method according to claim 13, wherein
after step d), the device is brought into a distance of the ferromagnetic elongated component in which a magnetic effect by magnetic fluxes on the ferromagnetic elongated component is smaller than a magnetic flux of a magnetic field prevailing environment, and
then the alternating current and the direct current through the coils are switched off.

16. The method according to claim 13, wherein the short-distance transport device additionally permits a rotational relative movement between the ferromagnetic core and the ferromagnetic elongated component about the longitudinal axis of the ferromagnetic elongated component and wherein the short-distance transport device in step d), in addition to the translational relative movement between the ferromagnetic core and the ferromagnetic elongated component along its entire length, also causes a rotational relative movement around the longitudinal axis of the ferromagnetic elongated component.

17. The method according to claim 13, wherein after the demagnetization, the remaining residual magnetism on the ferromagnetic elongated component is measured and the method is repeated for as long as needed with corrected direct current intensities until this residual magnetism has fallen below a predetermined tolerance value.

* * * * *